(12) United States Patent  (10) Patent No.: US 9,129,992 B2
Zhang et al.  (45) Date of Patent: Sep. 8, 2015

(54) METHOD FOR MANUFACTURING TRANSISTOR

(75) Inventors: Shengdong Zhang, Shenzhen (CN); Xin He, Shenzhen (CN); Longyan Wang, Shenzhen (CN)

(73) Assignee: PEKING UNIVERSITY SHENZHEN GRADUATE SCHOOL, Shenzhen, Guangdong (CN)

( * ) Notice: Subject to any disclaimer, the term of this patent is extended or adjusted under 35 U.S.C. 154(b) by 0 days.

(21) Appl. No.: 13/376,834

(22) PCT Filed: Jun. 13, 2011

(86) PCT No.: PCT/CN2011/075635
§ 371 (c)(1),
(2), (4) Date: Aug. 5, 2013

(87) PCT Pub. No.: WO2012/071878
PCT Pub. Date: Jun. 7, 2012

(65) Prior Publication Data
US 2013/0309808 A1 Nov. 21, 2013

(30) Foreign Application Priority Data
Dec. 1, 2010 (CN) .......................... 2010 1 0568303

(51) Int. Cl.
*H01L 21/00* (2006.01)
*H01L 29/66* (2006.01)
*H01L 29/786* (2006.01)

(52) U.S. Cl.
CPC .... *H01L 29/66742* (2013.01); *H01L 29/66969* (2013.01); *H01L 29/7869* (2013.01); *H01L 29/78648* (2013.01)

(58) Field of Classification Search
CPC ................. H01L 21/3105; H01L 29/78648; H01L 29/7869; H01L 29/66742; H01L 29/66969
USPC ........................................... 438/104
See application file for complete search history.

(56) References Cited

U.S. PATENT DOCUMENTS 6,673,661 B1 * 1/2004 Liu et al. .................. 438/157
7,643,101 B2 * 1/2010 Oh et al. .................. 349/43
(Continued)

FOREIGN PATENT DOCUMENTS

CN  101582453  * 11/2009  ........ H01L 29/78621

OTHER PUBLICATIONS

Office Action, Chinese Patent Application No. 201010568303.5, dated Mar. 1, 2012, 4 pages.

*Primary Examiner* — Richard Booth
(74) *Attorney, Agent, or Firm* — Perkins Coie LLP

(57) ABSTRACT

Designs and fabrication of dual-gate thin film transistors are provided. An active region and a top gate electrode of the transistor can be made of a transparent thin film material. A photoresist can be coated onto a surface of the transparent conductive thin film for forming the top gate electrode. Light is from the bottom of the substrate during exposure. After the development, a photoresist pattern aligned with the bottom gate electrode is formed on the surface of the conductive thin film. The top gate electrode aligned with the bottom gate electrode is formed by etching the conductive thin film. The bottom gate electrode can be used as a mask, which may save the cost for manufacturing the transistor and improve the accuracy of alignment between the top gate electrode and the bottom gate electrode and the performance of the dual-gate thin film transistor.

15 Claims, 3 Drawing Sheets

(56) References Cited

U.S. PATENT DOCUMENTS

2002/0084465 A1* 7/2002 Green et al. .................. 257/91
2004/0183130 A1* 9/2004 Hara ............................ 257/331
2008/0283831 A1* 11/2008 Ryu et al. ...................... 257/43
2009/0286351 A1* 11/2009 Hirao et al. ................... 438/104

* cited by examiner

METHOD FOR MANUFACTURING TRANSISTOR

FIELD OF THE INVENTION

The present invention relates to a method for manufacturing a transistor, especially to a method for manufacturing a dual-gate thin film transistor.

BACKGROUND OF THE INVENTION

Thin film transistors, as switching elements or integrated elements of peripheral driving circuits, are important elements in panel display technology. The exhibition of the panel display is directly dependent on the performance of the thin film transistors. Thin film transistors generally comprise single-gate transistors and dual-gate transistors. A dual-gate transistor in contrast to a single-gate transistor has advantage such as a high drive capability, a steep subthreshold slope, and a small circuit area. Combination of dual-gate transistors can be reasonably used to implement devices and circuits with new functions. However, the process for manufacturing dual-gate thin film transistors, especially planar dual-gate thin film transistors, is complicated. In particular, it is difficult to realize self-aligning in dual-gate thin film transistors. Conventional methods are those for manufacturing non-self-aligned. Non-self-aligning will cause the device to have a large performance dispersion and result in a large parasitic element such as a large parasitic capacitance, which is unacceptable to a panel display application. Thus, there is a need implement a method for manufacturing self-aligned dual-gate thin film transistors.

SUMMARY OF THE INVENTION

The present invention is to provide a method for manufacturing a transistor. With the method, a top gate electrode and a bottom gate electrode in a dual-gate thin film transistor can be aligned with each other accurately.

To this end, the present invention provides a method for manufacturing a transistor, comprising:
  forming a bottom gate electrode, an active region and a conductive thin film on a top of a substrate, orderly;
  coating a photoresist on the conductive thin film and forming a photoresist pattern by exposure during which light is from a bottom of the substrate; and
  etching the conductive thin film to form a top gate electrode by using the photoresist pattern formed by photolithography.

The bottom gate electrode may be made of a non-transparent material.

In an embodiment, a bottom gate dielectric layer is formed between the bottom gate electrode and the active region, a top gate dielectric is formed between the active region and the conductive thin film, the conductive thin film and the top gate dielectric are simultaneously etched by using the photoresist pattern formed by photolithography as a mask to form the top gate electrode and the top gate dielectric layer, respectively, and the substrate, the bottom gate dielectric layer, the active region, the top gate dielectric and the conductive thin film are transparent.

In an embodiment, the step of forming a bottom gate electrode, an active region and a conductive thin film on a top of a substrate, orderly, comprises:
  forming a metal thin film on the top of the substrate and then photolithographing and etching the metal thin film to form the bottom gate electrode;
  forming a bottom gate dielectric layer on the substrate and the bottom gate electrode;
  forming a metal oxide semiconductor layer for forming the active region on the bottom gate dielectric layer, forming an active region-protecting thin film, and then simultaneously photolithographing and etching the metal oxide semiconductor layer and the active region-protecting thin film so as to form the active region and a protective layer covering a top surface of the active region, respectively, wherein a portion of the active region aligned with the bottom gate electrode and the top gate electrode is a channel region, and two portions of the active region beside the channel region are a source region and a drain region;
  forming the top gate dielectric on the protective layer so as to cover the active region and the protective layer with the top gate dielectric and to extend the top gate dielectric onto the bottom gate dielectric layer; and
  forming the conductive thin film for forming the top gate electrode on the top gate dielectric.

The source region and the drain region may be processed by plasma projection after the top gate electrode is formed.

In an embodiment, the plasma projection is argon plasma projection, hydrogen plasma projection or ammonia plasma projection.

In an embodiment, the power of the plasma projection is 100-200 W and the pressure of the plasma projection is 0.1-1 Torr where the plasma projection is argon plasma projection.

In an embodiment, the bottom gate electrode is made of Cr, Mo, Ti or Al and has a thickness of 100-300 nm, the top gate electrode is made of indium tin oxide or aluminum zinc oxide and has a thickness of 100-300 nm, and the active region is made of a material based on zinc oxide or indium oxide and has a thickness of 50-200 nm.

In an embodiment, each of the bottom gate dielectric layer and the top gate dielectric layer is made of silicon nitride or silicon oxide, has a thickness of 100-400 nm, and formed by PECVD or magnetron sputtering, or each of the bottom gate dielectric layer and the top gate dielectric layer is made of aluminum oxide, tantalum oxide or hafnium oxide, has a thickness of 100-400 nm, and formed by magnetron sputtering.

DESCRIPTION OF THE PREFERRED EMBODIMENTS

Hereinafter, the present invention will be described in detail by means of embodiments thereof and with reference to the drawings.

In the prior art, the top gate electrode and bottom gate electrode of a dual-gate thin film transistor cannot be aligned with each other, accurately, due to its manufacturing process. This may result in a large parasitic capacitance in the transistor, which will impact the performance of the transistor. According to the present invention, a self-aligning process is used to manufacture the dual-gate thin film transistor by means of a light-tight design. In an example of the present invention, the light-tight design is utilized for manufacturing the bottom gate electrode. For example, a light-tight material may be used to form a light-tight bottom gate electrode. On the other hand, the light-transmission design is utilized for manufacturing the substrate, the top gate electrode and layers between the top gate electrode and the bottom gate electrode. For example, the substrate, the top gate electrode and layers between the top gate electrode and the bottom gate electrode may have the characteristic of light-transmission by using a light-transmission material or by designing the thickness. The bottom gate electrode is used as a mask when the top gate electrode pattern is formed by etching through the light from the substrate to the top. This may improve the accuracy of the alignment between the formed top and bottom gate electrodes.

Hereinafter, a detailed description of an example for forming a dual-gate thin film transistor will be given.

Figure 1:
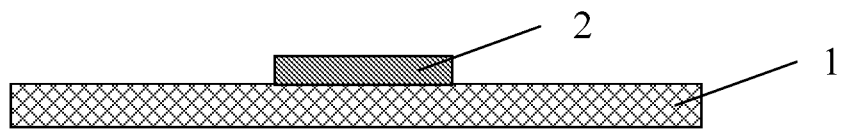
FIG. 1 shows a structure in which a bottom gate electrode has been formed on a substrate.

FIG. 1 shows a structure in which a bottom gate electrode has been formed on a substrate. The substrate 1 is a glass substrate or a substrate with a characteristic of light-transmission. A non-transparent thin film having a thickness of 100-300 nm is formed on the substrate 1 by the process of magnetron sputtering or thermal evaporation. The thin film may be formed of Cr, Mo, Ti, Al or the like. Then, the thin film is processed by photolithography or etching so as to form a bottom gate electrode 2. It should be appreciated by the skilled in the art that the bottom gate electrode 2 can be formed of another material with a characteristic of light-tight in some other embodiments. Depending on the material used to form the thin film, other processes for forming a film can be used to form the non-transparent thin film on the substrate 1. The thickness of the non-transparent thin film may be varied depending on the material to be used as long as requirements for parameters of the dual-gate thin film transistor can be satisfied and the film formed is light-tight enough.

Figure 2:
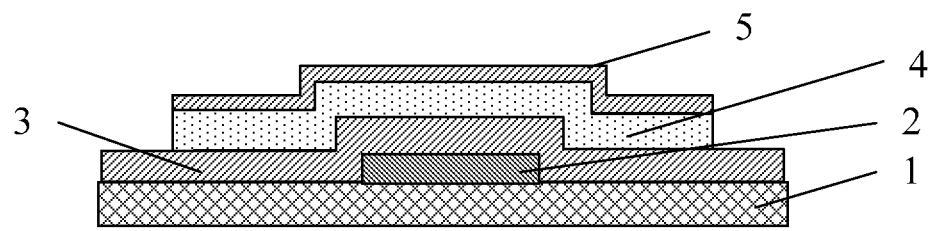
FIG. 2 shows a structure in which a bottom gate dielectric layer, an active region and an active region-protecting layer have been formed.

FIG. 2 shows a structure in which a bottom gate dielectric layer, an active region and an active region-protecting layer have been formed. Covering the bottom gate electrode 2 and the substrate 1 is a bottom gate dielectric layer 3 which may be an insulating dielectric thin film or a metal oxide thin film. In an example, an insulating dielectric thin film is formed on the substrate 1 and the bottom gate electrode 2 so that the formed film covers the bottom gate electrode 2 and extends onto the substrate 1. For example, an insulating dielectric thin film with a thickness of 100-400 nm may be formed by the Plasma Enhanced Chemical Vapor Deposition (PECVD). The insulating dielectric thin film as the bottom gate dielectric layer 3 may be a silicon nitride thin film or a silicon oxide thin film. In another example, a metal oxide thin film with a thickness of 100-400 nm may be formed by the process of magnetron sputtering. The material aluminum oxide, tantalum oxide, hafnium oxide or the like may be used to form the metal oxide thin film as the bottom gate dielectric layer 3. After the bottom gate dielectric layer 3 is formed, an amorphous or polycrystalline metal oxide thin film with a thickness of 50-200 nm and a metal oxide thin film or an insulating dielectric thin film with a thickness of 20-80 nm are formed on the bottom gate dielectric layer 3, orderly. These two films can be formed by the process of radio frequency magnetron sputtering. The active region 4 and the active region-protecting layer 5 may be formed via photolithography and etching. The material for forming the amorphous or polycrystalline metal oxide thin film of the active region may be indium oxide or based on zinc oxide. Where the material is indium oxide, the indium metal oxide semiconductor thin film is formed by sputtering. The purity of the ceramic target for sputtering is equal to or larger than 99.99%.

Figure 3:
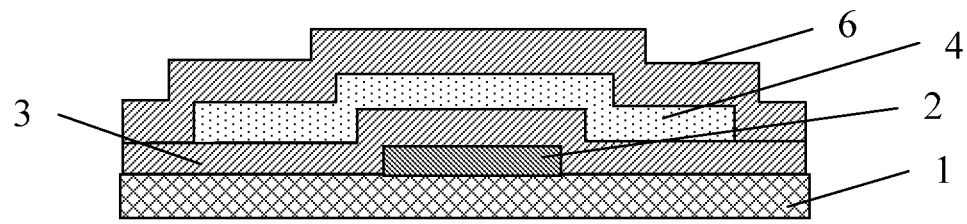
FIG. 3 shows a structure in which the top gate dielectric layer has been formed.

FIG. 3 shows a structure in which the active region and the active region-protecting layer have been formed. A dielectric thin film with a thickness of 100-400 nm is formed on the surface of the active region-protecting layer 5, and extends on and covers the bottom gate dielectric layer 3. In detail, the process of magnetron sputtering may be used to form a metal oxide thin film with a thickness of 100-400 nm, which may be aluminum oxide, tantalum oxide, hafnium oxide or the like. Alternatively, the process of magnetron sputtering or PECVD may be used to form an insulating dielectric thin film with a thickness of 100-400 nm, which may be silicon nitride or silicon oxide. The formed metal oxide thin film or insulating dielectric thin film together with the active region-protecting layer 5 form a top gate dielectric layer 6. The material of the active region-protecting layer 5 may be same to or different from that of the top gate dielectric layer 3. In an embodiment, the material of the active region-protecting layer 5 as shown in FIG. 2 is silicon oxide and that of the insulating dielectric thin film as shown in FIG. 3 is silicon oxide, too.

It should be appreciated that if only the metal oxide thin film for forming the active region is grown up and then the active region is formed via photolithography and etching in the step of FIG. 2 without forming the active region-protecting layer 5, a metal oxide thin film or an insulating dielectric thin film for forming the top gate dielectric layer 6 is formed directly on the surface of the region and extends on and covers the surface of the bottom gate dielectric layer 3 in the step of FIG. 3. The top surface of the active region can be protected from pollution and damage in subsequent steps (especially the pollution and damage during the formation of the active region 4 and the top gate dielectric layer 6 via photolithography and etching) by taking the barrier function of the active region-protecting layer 5 as shown in FIG. 2. Main pollution and damage are caused after the photolithography and etching for formation of the active region 4. Defects may occur in the surface of the active region during the drying-stripping or the formation of the gate dielectric layer 6. The active region 4 may be polluted during the transmission for different processes for the device, which may impact the characteristic of the device.

In the present embodiment, a protective dielectric layer is formed on the metal oxide semiconductor layer immediately after the metal oxide semiconductor layer for forming active region is formed. Then, the protective dielectric layer and the metal oxide semiconductor layer are processed simultaneously by photolithography and etching so as to form the protective layer and the active layer protected by the protective layer. Such a protective layer is used as a part of the top gate dielectric, finally. That is, the part of the top gate dielectric closely attached to the top surface of the active region is formed simultaneously together with the active region during manufacture, so that the active region and the top gate dielectric can be attached to each other fastened and the possible pollution and damage to the top surface of the active region can be prevented during the photolithography and etching for the active region and the manufacturing of the top gate dielectric, which may improve the performance of the device.

Figure 4:
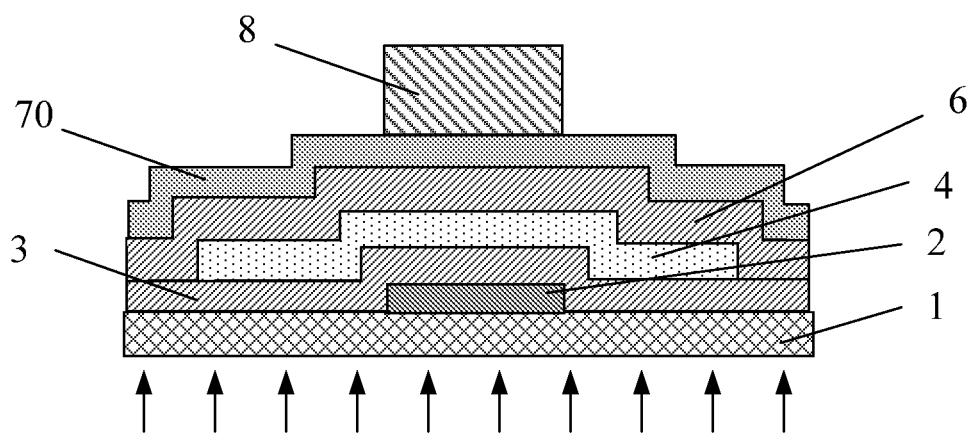
FIG. 4 shows a structure during the exposure.

FIG. 4 shows a structure during the exposure. On the basis of the structure as shown in FIG. 3, a transparent conductive thin film 70 with a thickness of 100-300 nm is deposited by using the process of radio frequency magnetron sputtering, so as to subsequently form the top gate electrode 7. The material of the conductive thin film 70 may be indium tin oxide, aluminum zinc oxide or the like. Then, a layer of positive photoresist is coated onto the surface of the transparent conductive thin film 70. During the exposure, light is from the bottom of the substrate 1. The arrows shown in FIG. 4 indicate the exposure direction. Then, the development is conducted. After the exposure and development, a photoresist pattern 8 is formed as shown in FIG. 4. Since the bottom gate electrode functions as the mask during the photolithography, the shape and the size of the photoresist pattern 8 is the same to that of the surface of the bottom gate electrode and the photoresist pattern 8 is just aligned with the bottom gate electrode. It should be appreciated that the photoresist coated also can be a negative photoresist. Since the pattern of the negative photoresist formed after the development of the photolithography should be complementary with the pattern of the position photoresist, the lift-off technique should be utilized for forming the self-aligning structure.

In the present embodiment, during the formation of the top gate electrode pattern via the photolithography, the photoresist is coated on the top face of the transparent conductive thin film for forming the top gate electrode. During the exposure, light is from the bottom face of the glass substrate. Since the glass substrate, the active region and the conductive thin film all have the characteristic of light-transmission and the bottom gate electrode has the characteristic of light-tight, the bottom gate electrode functions as the mask during the exposure. By such a manner, the additional cost for manufacturing the mask is saved. Moreover, since the bottom gate electrode functions as the mask, the top gate electrode formed by etching the conductive thin film can be accurately aligned with the bottom gate electrode, which may reduce the possibility of generating a parasitic element and improve the uniformity of the performance of the device.

Figure 5:
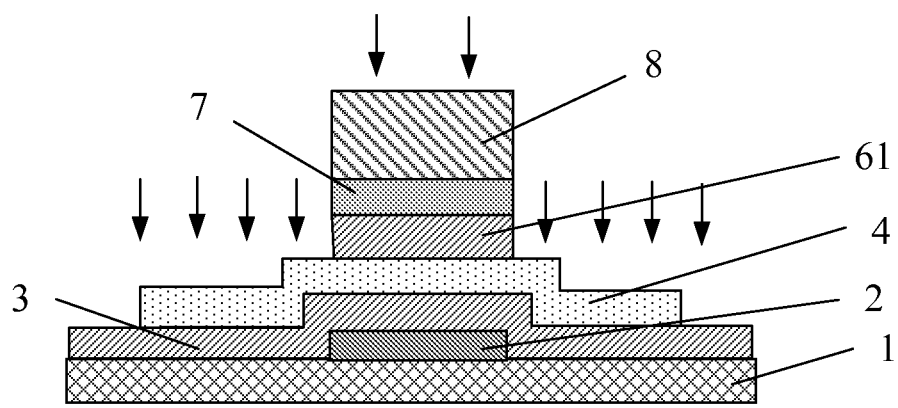
FIG. 5 shows a structure in which a top gate dielectric and a top gate electrode have been formed by etching and the source and drain regions are processed by plasma.

FIG. 5 shows a structure in which a top gate dielectric layer and a top gate electrode have been formed. The top gate dielectric 6 and the conductive thin film 70 covered with the photoresist pattern 8 as shown in FIG. 4 are etched, so as to form a top gate dielectric layer 61 and a top gate electrode 7. The region of the active region 4 aligned with the bottom gate electrode 2 and the top gate electrode 7 is a channel region, and two regions aside the channel region are a source region and a drain region. The photoresist pattern 8 can be removed after the top gate dielectric layer 61 and the top gate electrode 7 are formed.

In another embodiment, the source and drain regions are processed by plasma without removing the photoresist 8, which may reduce the parasitic resistances of the source and drain regions themselves. During the plasma projection, the top gate electrode 7 may be protected by the photoresist pattern 8 so as to avoid any impact to the top gate electrode by the plasma process. As shown in FIG. 5, the arrows indicate the plasma projection direction. In the process, a gas of argon, hydrogen, ammonia or the like is projected to the surfaces of the source and drain regions. The more the carrier concentration is, the less the parasitic resistance is. In an example, the power of the argon plasma is 100-200 W and the pressure is 0.1-1 Torr.

Figure 6:
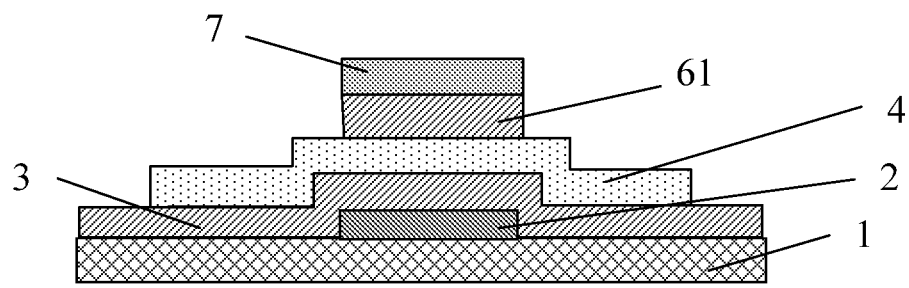
FIG. 6 shows a structure in which the photoresist as shown in FIG. 5 has been removed.

FIG. 6 shows a structure in which the photoresist as shown in FIG. 5 has been removed. The photoresist 8 may be removed from the top gate electrode 7 by acetone ultrasonic or dry-stripping.

Figure 7:
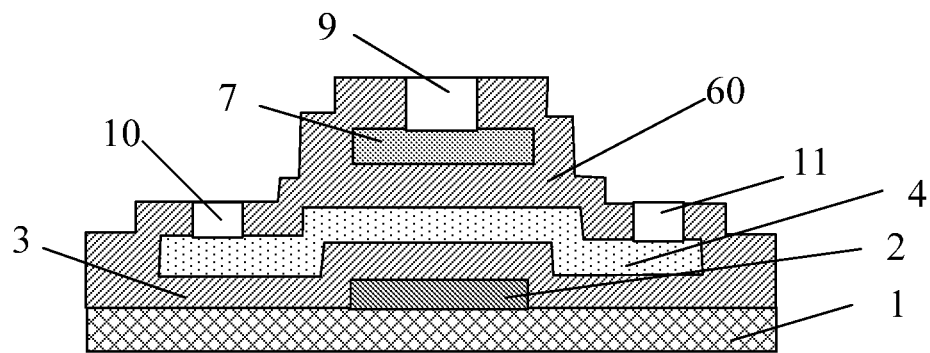
FIG. 7 shows a structure in which the contact holes for the electrodes of the transistor have been formed.

FIG. 7 shows a structure in which the contact holes for the electrodes of the transistor have been formed. On the basis of the structure as shown in FIG. 6, a silicon nitride layer 60 having a thickness of 100-300 nm is deposited by magnetron sputtering or PECVD. Then, the contact holes for the electrodes are formed by photolithography and etching. In an embodiment, there are a gate contact hole 9, a source contact hole 10 and a drain contact hole 11.

Figure 8:
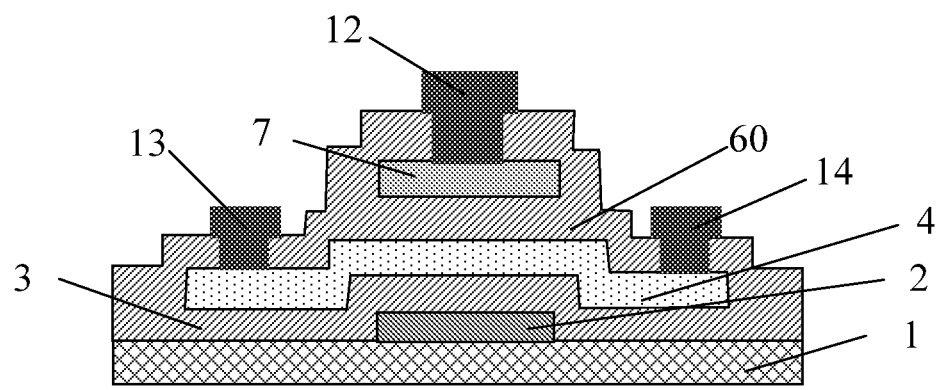
FIG. 8 shows a structure in which the metal electrodes have been formed.

FIG. 8 shows a structure in which the metal electrodes have been formed. On the basis of the structure as shown in FIG. 7, a Ti film with a thickness of 100-300 nm is deposited by magnetron sputtering. Then, metal leading electrodes and interconnection wires for the electrodes of the transistor are formed by photolithography and etching. In addition, the top gate electrode 7 and the bottom gate electrode 2 are connected. In an embodiment, there are a gate leading wire 12, a source leading wire 13 and a drain leading wire 14.

With the method as described above, the made dual-gate metal oxide thin film transistor has a bottom gate electrode and a top gate electrode aligned with each other so as to reduce or eliminate parasitic elements such as parasitic capacitance, which may improve the performance of the transistor.

It is noted that the present invention is not limited to the above embodiments. Without departing the concept of the present invention, simple deduction or substitution made by the skilled in the art should be within the protection scope of the present invention.

The invention claimed is:

1. A method for manufacturing a transistor, comprising
forming a bottom gate electrode, an active region and a conductive thin film on a top of a substrate;
coating a photoresist on the conductive thin film and forming a photoresist pattern by exposure during which light is from a bottom of the substrate; and
etching the conductive thin film to form a top gate electrode by using the photoresist pattern formed by photolithography, wherein the top gate electrode is separated from the bottom gate electrode by the active region,
wherein the bottom gate electrode is made of a non-transparent material, and wherein a bottom gate dielectric layer is formed between the bottom gate electrode and the active region, a top gate dielectric is formed between the active region and the conductive thin film, the conductive thin film and the top gate dielectric are simultaneously etched by using the photoresist pattern formed by photolithography as a mask to form the top gate electrode and the top gate dielectric layer, respectively, and the substrate, the bottom gate dielectric layer, the active region, the top gate dielectric and the conductive thin film are transparent, and
wherein the forming of the bottom gate electrode, the active region and the conductive thin film on the top of a substrate comprises:
forming a metal thin film on the top of the substrate and then photolithographing and etching the metal thin film to form the bottom gate electrode;
forming a bottom gate dielectric layer on the substrate and the bottom gate electrode;
forming a metal oxide semiconductor layer for forming the active region on the bottom gate dielectric layer, forming an active region-protecting thin film, and then simultaneously photolithographing and etching the metal oxide semiconductor layer and the active region-protecting thin film so as to form the active region and a protective layer covering a top surface of the active region, respectively, wherein a portion of the active region aligned with the bottom gate electrode and the top gate electrode is a channel region, and two portions of the active region beside the channel region are a source region and a drain region;

forming the top gate dielectric on the protective layer so as to cover the active region and the protective layer with the top gate dielectric and to extend the top gate dielectric onto the bottom gate dielectric layer; and forming the conductive thin film for forming the top gate electrode on the top gate dielectric.

2. The method according to claim 1, wherein a material of the protective layer is same to or different from that of the top gate dielectric layer.

3. The method according to claim 1, further comprising processing the source region and the drain region by plasma projection after the top gate electrode is formed.

4. The method according to claim 3, wherein the plasma projection is argon plasma projection, hydrogen plasma projection or ammonia plasma projection.

5. The method according to claim 4, wherein the power of the plasma projection is from 100 W to 200 W and the pressure of the plasma projection is from 0.1 Torr to 1 Torr where the plasma projection is argon plasma projection.

6. The method according to claim 1, wherein the bottom gate electrode is made of Cr, Mo, Ti or Al and has a thickness between 100 nm and 300 nm, the top gate electrode is made of indium tin oxide or aluminum zinc oxide and has a thickness between 100 nm and 300 nm, and the active region is made of a material based on zinc oxide or indium oxide and has a thickness between 50 nm and 200 nm.

7. The method according to claim 1, wherein each of the bottom gate dielectric layer and the top gate dielectric layer is made of silicon nitride or silicon oxide, has a thickness between 100 nm and 400 nm, and formed by PECVD or magnetron sputtering, or each of the bottom gate dielectric layer and the top gate dielectric layer is made of aluminum oxide, tantalum oxide or hafnium oxide, has a thickness between 100 nm and 400 nm, and formed by magnetron sputtering.

8. The method of claim 1, further comprising:

forming a protective layer covering a top surface of the active region; and forming a top gate dielectric layer above the protective layer and below the conductive thin film.

9. The method of claim 1, wherein the bottom gate dielectric layer includes an insulating dielectric think film or a metal oxide thin film.

10. The method of claim 1, wherein the protective layer is used to form a part of the top gate dielectric.

11. The method of claim 1, wherein the active region and the top gate dielectric are attached to each other.

12. The method of claim 1, wherein the photoresist pattern has the shape and the size as same as those of the surface of the bottom gate electrode.

13. The method of claim 1, wherein the substrate, the active region and the conductive thin film have the characteristic of light-transmission and the bottom gate electrode has the characteristic of light-tight.

14. The method of claim 1, wherein the bottom gate electrode functions as a mask such that the top gate electrode is aligned with the bottom gate electrode.

15. The method of claim 1, further comprising: after the etching of the conductive thin film to form the top gate electrode, removing the photoresist pattern from the top gate electrode.

* * * * *